United States Patent
Huang (10) Patent No.: US 11,483,006 B2
(45) Date of Patent: Oct. 25, 2022

(54) MULTI-PHASE FRACTIONAL DIVIDER

(71) Applicant: Intel Corporation, Santa Clara, CA (US)

(72) Inventor: Mingwei Huang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 16/052,539

(22) Filed: Aug. 1, 2018

(65) Prior Publication Data

US 2018/0343012 A1 Nov. 29, 2018

Related U.S. Application Data

(63) Continuation of application No. 13/609,894, filed on Sep. 11, 2012, now Pat. No. 10,205,459.

(51) Int. Cl.
| | |
|---|---|
| *H03L 7/197* | (2006.01) |
| *H03L 7/081* | (2006.01) |
| *H03L 7/099* | (2006.01) |

(52) U.S. Cl.
CPC .......... *H03L 7/1976* (2013.01); *H03L 7/081* (2013.01); *H03L 7/0998* (2013.01)

(58) Field of Classification Search
CPC ..... H03L 7/081; H03L 7/0812; H03L 7/0814; H03L 7/0816; H03L 7/0818; H03L 7/0998; H03L 7/1976; H03L 7/1978
USPC .......................... 327/156, 159; 375/373, 376
See application file for complete search history.

(56) References Cited

U.S. PATENT DOCUMENTS

| | | | | |
|---|---|---|---|---|
| 6,812,760 B1* | 11/2004 | Kim | ...................... | H03L 7/0818 |
| | | | | 327/158 |
| 7,639,053 B2* | 12/2009 | Shen | ...................... | H03L 7/1976 |
| | | | | 327/115 |
| 7,804,344 B2 | 9/2010 | Ma et al. | | |
| 7,904,264 B2* | 3/2011 | Boerstler | ............. | H03K 5/1565 |
| | | | | 327/175 |
| 2008/0164917 A1 | 7/2008 | Floyd et al. | | |
| 2008/0225989 A1 | 9/2008 | An et al. | | |
| 2009/0201066 A1* | 8/2009 | Do | ............................ | G06F 1/08 |
| | | | | 327/299 |
| 2011/0148490 A1* | 6/2011 | Lee | ......................... | H03L 7/085 |
| | | | | 327/159 |
| 2012/0063521 A1* | 3/2012 | Shin | ....................... | H03L 7/081 |
| | | | | 375/259 |

OTHER PUBLICATIONS

Kim et al. (A 0.3-1.4 GHz All-Digital Fractional-N PLL With Adaptive Loop Gain Controller, IEEE Journal of Solid-State Circuits, vol. 45, No. 11, Nov. 2010).*
Notice of Allowance from U.S. Appl. No. 13/609,894 dated Sep. 26, 2018, 7 pgs.
Final Office Action from U.S. Appl. No. 13/609,894 dated Aug. 15, 2013, 12 pgs.

(Continued)

*Primary Examiner* — Patrick C Chen
(74) *Attorney, Agent, or Firm* — Schwabe, Williamson & Wyatt, P.C.

(57) ABSTRACT

Described is an apparatus comprising: a multi-modulus divider; and a phase provider to receive a multiphase periodic signal and operable to rotate phases of the multiphase periodic signal to generate an output which is received by the multi-modulus divider.

20 Claims, 6 Drawing Sheets

(56) References Cited

OTHER PUBLICATIONS

Final Office Action from U.S. Appl. No. 13/609,894 dated Jul. 15, 2014, 16 pgs.
Non-Final Office Action from U.S. Appl. No. 13/609,894 dated Apr. 8, 2013, 11 pgs.
Non-Final Office Action from U.S. Appl. No. 13/609,894 dated Dec. 17, 2013, 14 pgs.

\* cited by examiner

MULTI-PHASE FRACTIONAL DIVIDER

CLAIM OF PRIORITY

This application is a continuation of, and claims priority to, U.S. patent application Ser. No. 13/609,894, filed on Sep. 11, 2012 and titled "MULTI-PHASE FRACTIONAL DIVIDER", which is incorporated by reference in its entirety for all purposes.

BACKGROUND

Dividers are used for dividing a frequency of a signal. For example, an output of an oscillator may be divided by a divider into a slower frequency periodic signal relative to the output frequency of the oscillator. Many high performance computing and/or communication systems use on-die system clock frequency with fine resolution, for example, in the order of 10 to 100 Hz. Generally, system clock is generated by a Phase Locked Loop (PLL). The reference input clock for the PLL is generally provided by a fixed frequency crystal oscillator. Since the input frequency of the reference clock is fixed, one way to generate finer system clock frequency is to select a lower reference clock frequency and use an integer divider with as large as possible division ratios to divide the output clock frequency of the PLL to generate a feedback clock signal with same frequency as the reference clock frequency.

However, this method of using integer divider using large division ratio and lower reference clock frequency limits the design space. For example, generating finer frequency steps in the PLL output clock becomes a challenge. The method and apparatus of using integer divider using large division ratios also causes the system clock's resolution to be limited by the lowest possible reference clock frequency.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Fine frequency resolution may be generated with a fractional divider. In such a case, the PLL feedback divider ratio is dynamically modulated so that the average PLL divider ratio can be a fractional number. The feedback divider may be modulated by a sigma-delta modulator. However, such a fractional divider suffers from large PLL phase error and jitter, especially in PLLs with large bandwidth and open-loop gain, because the instantaneous divider ratio is an integer number. For example, the PLL phase error could be as large as ⅕th of a reference clock, and the PLL bandwidth could be as high as ⅒th of the reference clock frequency period.

One way to reduce the fractional divider induced phase error and jitter is to dynamically introduce the same magnitude but opposite sign phase error through the loop filter. Such mechanism makes the analog loop filter complex in design.

The embodiments discussed herein combine a multiplexer with a bi-directional phase-rotator, a multi-modulus divider, and a sigma-delta modulator to meet wide divider range. For example, the divider range may be from divide-by 5.000015 to divide-by 254.999985, where divide-by 5.000015 is the starting point of the divider range and divide-by 254.999985 is the ending point of the divider range. In this embodiment, the step size is of the divider range is 1/65536=0.000015. However, the embodiments herein are not limited to the above divide-by range and other ranges may be used without changing the essence of the embodiments of the disclosure. The embodiments discussed herein also provide a glitch-free low power Multi-Phase Multi-Modulus Frequency Divider (MMFD) with ditherless (i.e., without dither) and dithering (i.e., with dither) options. Other technical effects will be evident from various embodiments discussed herein The term "jitter" herein refers to minimum instantaneous jitter in the clock signal generated by an oscillator. The terms "substantially," "close," "approximately," herein refer to being within +/−20% of a target value.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

Figure 1:
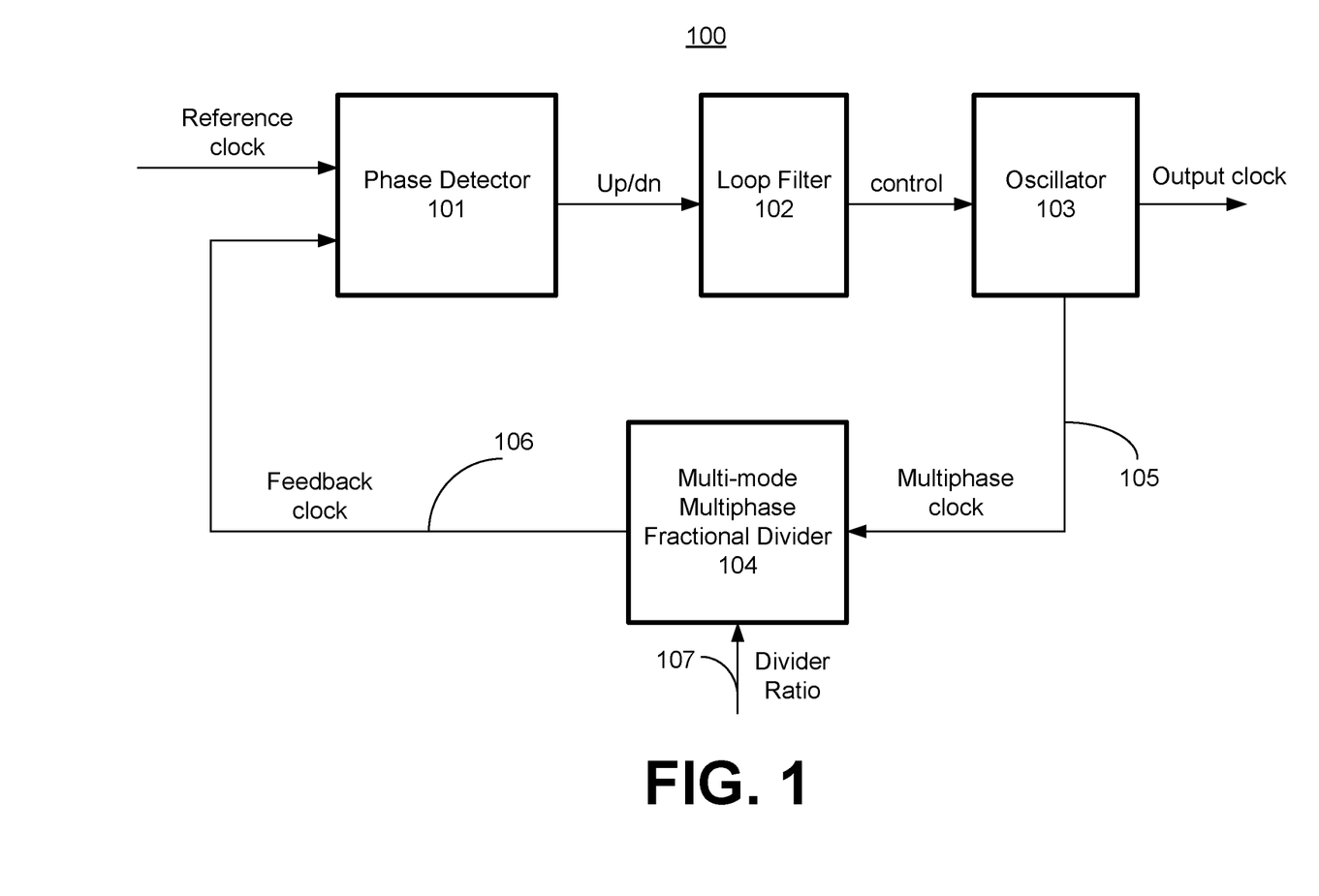
FIG. 1 is a clock generation unit including a multi-mode multi-phase fractional divider (MMFD), according to one embodiment of the disclosure.

FIG. 1 is a clock generation unit 100 including an MMFD 104, according to one embodiment of the disclosure. In one embodiment, the clock generation unit 100 comprises a phase detector 101, a loop filter 102, an oscillator 103, and an MMFD 104. In one embodiment, the clock generation unit 100 is a digital phase locked loop (DPLL). In one embodiment, the DPLL is an all digital phase locked loop (ADPLL). In one embodiment, the clock generation unit 100 is a mixed signal phased locked loop, for example, a self-biased PLL (SBPLL). In other embodiments, other architectures of the PLL may be used with the embodiments of MMFD 104 discussed herein. So as not to obscure the embodiments, other components of the clock generation unit 100 are not disclosed. The phase detector 101 receives a reference clock and compares with the feedback clock 106 generated by the MMFD 104 to determine whether the oscillator 103 should operate faster or slower than its previous oscillation speed. The reference clock signal may be generated by a clock crystal oscillation or any other clock signal source.

The phase detector 101 generates an up/down (up/dn) signal indicting the difference in phase (or frequency) of the reference clock and the feedback clock 106. The up/dn signal instructs the oscillator to slow down or speed up the oscillation frequency of its output signal compared to its previous oscillation speed. The up/dn signal is then filtered by a loop filter 102. In one embodiment, the loop filter 102 is an analog loop filter with a charge pump and a filter component. In another embodiment, the loop filter 102 is digital loop filter that generates a digital filtered code to control the oscillator. The output of the loop filter 102 is a control signal which is received by the oscillator 103, where the control signal is used to adjust the oscillation frequency of the output clock signal.

In one embodiment, the oscillator 103 is a voltage controlled oscillator (VCO) and the control signal from the loop filter is an analog voltage to control the oscillating frequency of the VCO 103. In another embodiment, the oscillator 103 is a digitally controlled oscillator (DCO) and the control signal from the loop filter is a digital code to adjust the oscillating frequency of the DCO 103.

In one embodiment, the MMFD 104 receives a multi-phase clock signal 105 from the oscillator 103 and generates the feedback clock signal 106 according a divider ratio 107. In one embodiment, the divider ratio 107 is at least one of an integer and/or fractional divider ratio. In one embodiment, the multi-phase clock signal 105 includes phases which are substantially equally separated phases.

In one embodiment, the multi-phase clock signal 105 is generated by tapping signals from nodes of the outputs of the oscillator delay stages (not shown) in the oscillator 103. In one embodiment, a phase interpolator (not shown) may be used to generate the multi-phase clock signal 105 from a periodic signal generated by or within the oscillator 103. In other embodiments, any known circuit may be used to generate the multi-phase clock signal 105 as input for the MMFD 104.

So as not to obscure the embodiments of the disclosure, the multi-phase clock signal 105 described in this disclosure comprises eight phases—p0 to p7. However, any number of phases may be used and various components of the MMFD 104 can be modified to accommodate any number of phases. In one embodiment, the MMFD 104 is glitch-free with ditherless and dithering dividing options.

Figure 2:
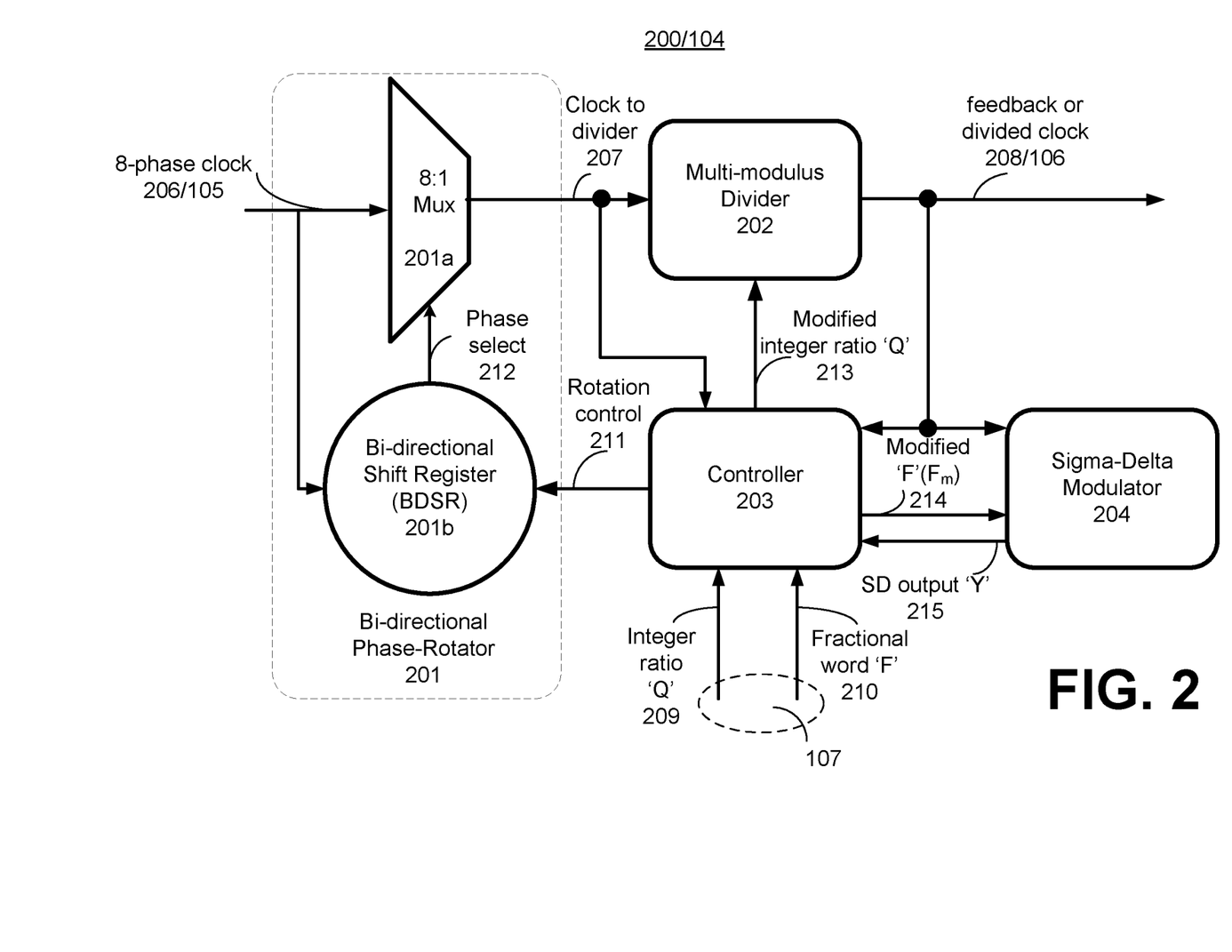
FIG. 2 is an MMFD, according to one embodiment of the disclosure.

FIG. 2 is an MMFD 200/104, according to one embodiment of the disclosure. In one embodiment, the MMFD 200/104 comprises a bi-directional phase rotator 201, a multi-modulus divider 202, a controller 203, and a signal-delta (SD) modulator 204. Embodiments of FIG. 2 are described with reference to FIG. 1.

In one embodiment, the bi-directional phase rotator 201 comprises a multiplexer 201a coupled to a bi-directional shift register 201b. In the embodiments discussed herein, the multiplexer 201a is an 8:1 multiplexer which is operable to receive an eight phase (8-phase) clock signal 206/105 and to provide a clock signal 207 for the multi-modulus divider 202 according to phase select signal 212 generated by the bi-directional shift register 201b. A non-limiting analogy of the bi-directional shift register 201b is that of a dial that can move clockwise or counter clockwise in response to a rotation control signal 211 from the controller 203.

For example, the rotation control signal 211 may indicate to the bi-directional shift register 201b to select a previous phase (previous in time domain) clock signal for the clock signal 207 for the divider 202. For instance, phase p7 is a previous phase of phase p0. Selecting a previous phase is analogous to moving the dial counter clockwise. In another example, the rotation control signal 211 may indicate to the bi-directional shift register 201b to select a next phase (next in time domain) clock signal for the clock signal 207 for the divider 202. For instance, phase p1 is a next phase of phase p0. Selecting the next phase is analogous to moving the dial clockwise. In one embodiment, the rotation control signal 211 is glitch free.

In one embodiment, the controller 203 receives the divider ratio 107 as integer ratio 'Q' component 209 and a fractional word 'F' component 210. For example, when the divider ratio 107 is "8.5," the 'Q' component 209 is '8' and the 'F' component 210 is '0.5.' In one embodiment, the fractional word 'F' component 210 further comprises other fractional components. For example, when the divider ratio 107 is "8.55," the 'Q' component 209 is '8' and the 'F' component 210 comprises a first component F1 as "0.5" and a second component F2 as "0.05."

In one embodiment, the controller 203 receives the output 208/106 (same as feedback clock in FIG. 1) of the multi-modulus divider 202, the input clock signal 207 to the modulus divider 202, output 215 of the sigma-delta modulator 204, and the divider ratio 107 to generate a modified integer ratio 'Q' 213 for the modulus divider 202 and to generate the rotation control signal 211 that determines the clock phase signal 207 for the modulus divider 202.

In one embodiment, the 8-phase clock 206/105 is generated from an 8-phase ring oscillator 103 with substantially equally separated phases. In one embodiment, the 8-phase clock 206/105 is generated from a phase interpolator that receives an input clock from the oscillator 103 or any other clock source. In one embodiment, the substantially equally separated eight phases are made substantially equally separated from one another by matching devices (transistors) and interconnects. The term "matching" herein refers to making the devices or interconnects substantially the same in terms of design, layout, and other electrical characteristics.

In one embodiment, the MMFD 200/104 supports three or more modes of operations including: integer mode, ditherless fractional mode with resolution of ⅛, and dithering fractional mode with the resolution limited by the resolution of the sigma-delta modulator. The ditherless fractional mode with resolution of ⅛ is for the 8-phase clock 206/105 example. In other embodiments where the clock signal 206/105 has different number of phases (different from 8), the ditherless fractional mode resolution changes accordingly. For example, when the clock signal 206/105 is a 16 phase clock signal, then the ditherless fractional mode resolution is 1/16.

In one embodiment, when integer mode of the controller 203 is selected (for example, the divider ratio 107 is integer only), the controller 203 enables the multiplexer 201a via the bi-directional shift register 201b to select the first phase (or phase zero) for the signal 207. In one embodiment, during the integer mode other circuits (e.g., the sigma-delta modulator 204) of the MMFD 200/104 are disabled to save power consumption.

In one embodiment, when the ditherless fraction mode of the controller 203 is selected, the controller 203 provides the appropriate rotation control signal 211 to the bi-directional phase-rotator 201 (also referred herein as a phase provider). In one embodiment, the ditherless fraction mode can be realized when the input fractional word 'F' is i/8, where i=1, 2, ..., 7.

Figure 5:
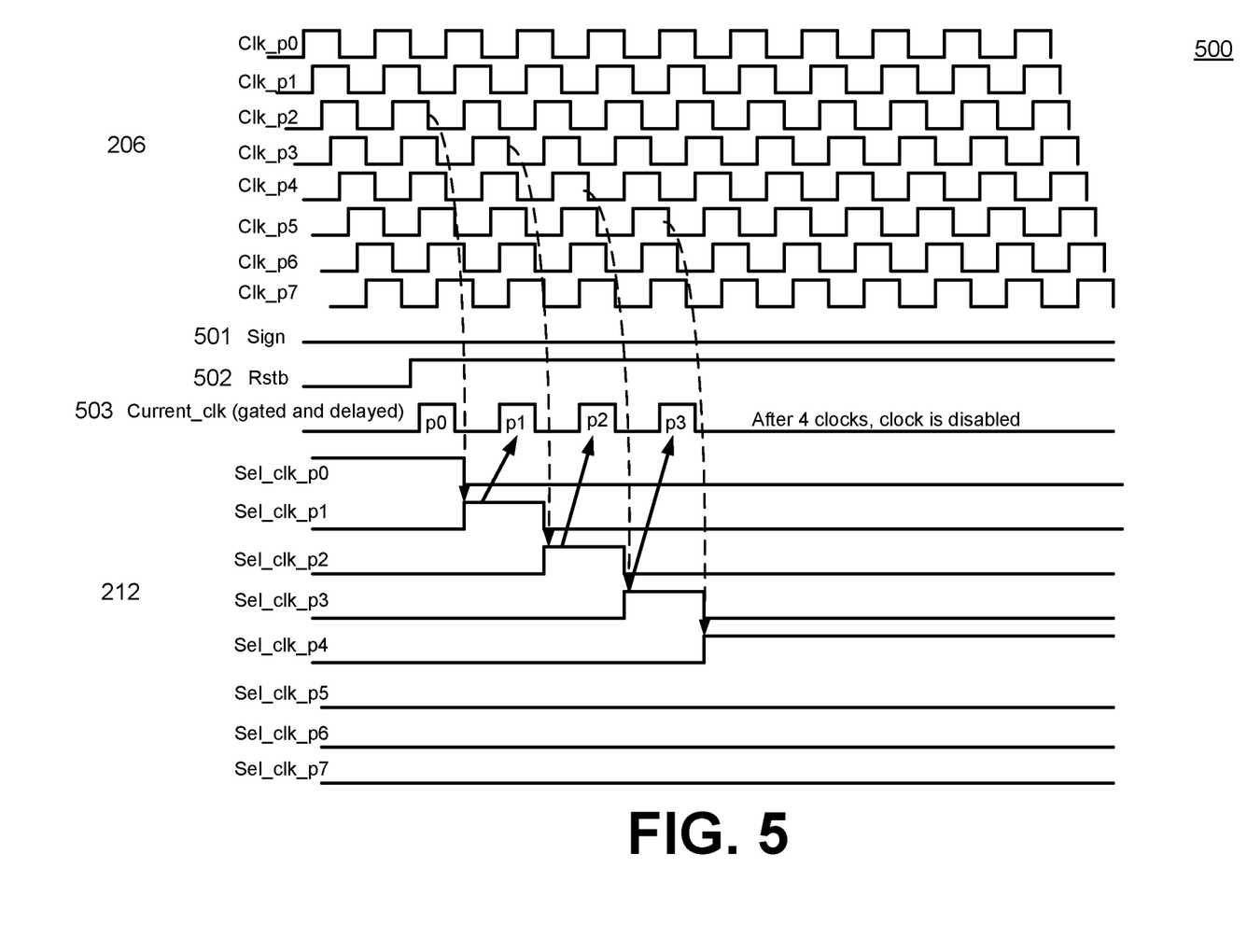
FIG. 5 is a timing diagram of the signals associated with the bi-directional shift-register, according to one embodiment of the disclosure.

For example, if the divider ratio 107 is N+⅛, the controller 203 then sets the integer divider ratio to N, and commands the bi-directional phase rotator 201 via the rotation signal 211 to rotate the multiplexer output 207 phase once per divided clock cycle, from p0→p1→p2→ . . . →p7→p0 continuously, and thus realizes the equivalent divider ratio of N+⅛, where "pN" refers to the clock phase signal, and where 'N' is 0 to 7 as shown in FIG. 5.

Referring back to FIG. 2, in one embodiment during the ditherless fraction mode, the sigma-delta modulator 204 is not in use and can be disabled to save power. If the 'F' component 210 is less or equal to ⅘, the integer divider ratio 'Q' 213 is N, and the bi-directional phase rotator 201 is commanded to rotate clockwise by the rotation signal 211. The number '4' in '⅘' above is a programmable or predetermined threshold. In other embodiments, other threshold numbers instead of '4' may be used. As mentioned above, a clockwise rotation refers to selecting the phase immediately next to the current phase from among the 8-phase clock signal 206/105.

If the 'F' component 210 is larger than ⅘, the integer divider ratio 213 is set to N+1, and the bi-directional phase rotator 201 is commanded to rotate counter-clockwise with step of (1−K) times 8. As mentioned above, a counter clockwise rotation refers to selecting the phase immediately previous to the current phase from among the 8-phase clock signal 206/105.

For example, if the divider ratio is N+⅝, instead of setting the integer divider ratio 'Q' 213 to N by the controller 203 and rotating the phase clockwise with a step of 5 phases, the integer divider ratio 'Q' 213 is set to N+1, and the phase-rotator 201 is commanded by the controller 203 to rotate the phase counter-clockwise with step size of (1−⅝) times 8=3 phases.

In addition to relaxing the timing requirement for the fractional divider mode operation, the bi-directional phase rotator 201 may also reduce the minimum integer divider ratio from 8, in single-directional phase rotator case, to 5.

In one embodiment, when the dithering fractional mode (3$^{rd}$ mode) is selected, the controller 203 provides the appropriate rotation control signal 211 to the bi-directional phase-rotator 201. In one embodiment, dithering fractional mode is selected when, for example, the 'F' component 210 is not equal to i/8, where i=0, 1, ..., 7.

In one embodiment, the controller 203 calculates the ditherless fractional part by computing floor(F*8), and adjusts the integer divider ratio 'Q' 213 as described in the ditherless fraction mode case. The term "floor(x)" (where x=F*8 in the example discussed herein) generally refers to the largest integer not greater than 'x.' In such an embodiment, the modified 'F' 214 i.e., $F_m$=F*8−floor(F*8), is provided to the sigma-delta modulator 204 to generate the dithering.

In one embodiment, the sigma-delta modulator 204 is turned on, and the $F_m$ 214 value is provided to the sigma-delta modulator 204 as input. In one embodiment, the sigma-delta modulator 204 is a first order sigma-delta modulator. In other embodiments, higher order sigma-delta modulators may be used. In one embodiment, the sigma-delta modulator 204 generates the dithering output 'Y' 215 with its mean value of $F_m$ 214. In one embodiment, the output 215 is used for dithering the bi-directional shift register 201b by the controller 203. In one embodiment, dithering of the bi-directional shift register 201b causes change in the divider output 208/106 such that the averaged divider output frequency is equal to the desired divider value.

In one embodiment, since the effective contribution of the modified 'F' (i.e., $F_m$) 214 is limited to the range of (0,⅛), a first order sigma-delta modulator may be used for the sigma-delta modulator 204. The range "(0,⅛)" refers to a range of $F_m$ 214 which does not include 0 and ⅛.

In such an embodiment, the maximum instantaneous timing jitter is limited to ⅛$^{th}$ of the period of the output clock from the oscillator 103, which is significantly smaller than one period of the output clock from the oscillator 103 (18 dB smaller). In one embodiment, further reduction in instantaneous timing jitter is achieved by increasing the number of the phases to 16 or 32. For example, the instantaneous jitter is reduced to 1/16th and 1/32ndth of the period of the output clock from the oscillator 103.

Figure 4:
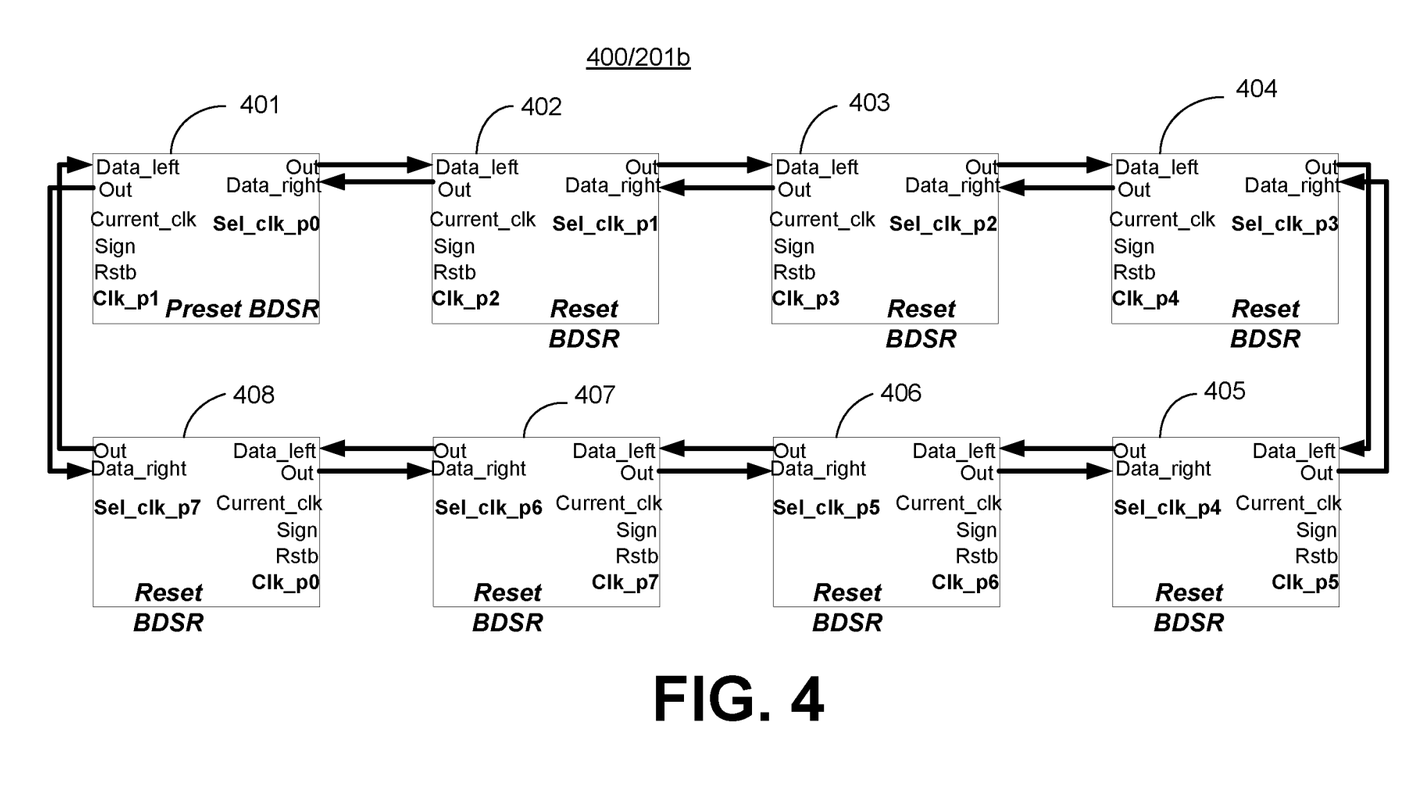
FIG. 4 is a bi-directional shift-register of a phase rotator of the MMFD, according to one embodiment of the disclosure.

In one embodiment, the bi-directional shift-register 201b is a double-ring structure as shown in FIG. 4. In one embodiment, at any given time, one of the following three modes is allowed to be performed by the bi-directional shift-register 201b: halt, rotating clockwise, and rotating counter-clockwise. In other embodiments, fewer or more modes may be allowed to be performed by the bi-directional shift-register 201b. In one embodiment, the rotation is controlled by the controller 203 for both the number of rotations and the direction of the rotations. In one embodiment, the glitch-free operation is realized by the observation that no glitches are possible if the multiplexer 201a selection clock phase is 5 phase lagging of the rotation clock. For example, because at the rising edge of the +5 phase clock, both p0 and p1 clocks (see, FIG. 5) are low, switching at this time will not generate any glitch.

The embodiments discussed herein may exhibit several advantages. For example, the MMFD 104 seamlessly combines integer mode, ditherless fractional mode, and dithering fractional mode divider in a single divider. In another example, all operations of the MMFD 104 are glitch-free and correct-by-construction. Utilizing a unique bi-directional phase rotator 201 reduces the minimum fractional mode divider ratio (integer 'Q' part) from N to N/2+1, where N is the number of input phases. In one embodiment, the MMFD 104 is implemented with a single multi-modulus divider 202 to save area/power. Depending on the mode of the operation, the un-used circuits can be powered down to save power consumption. These and many other advantages may be realized by the embodiments discussed herein.

Figure 3:
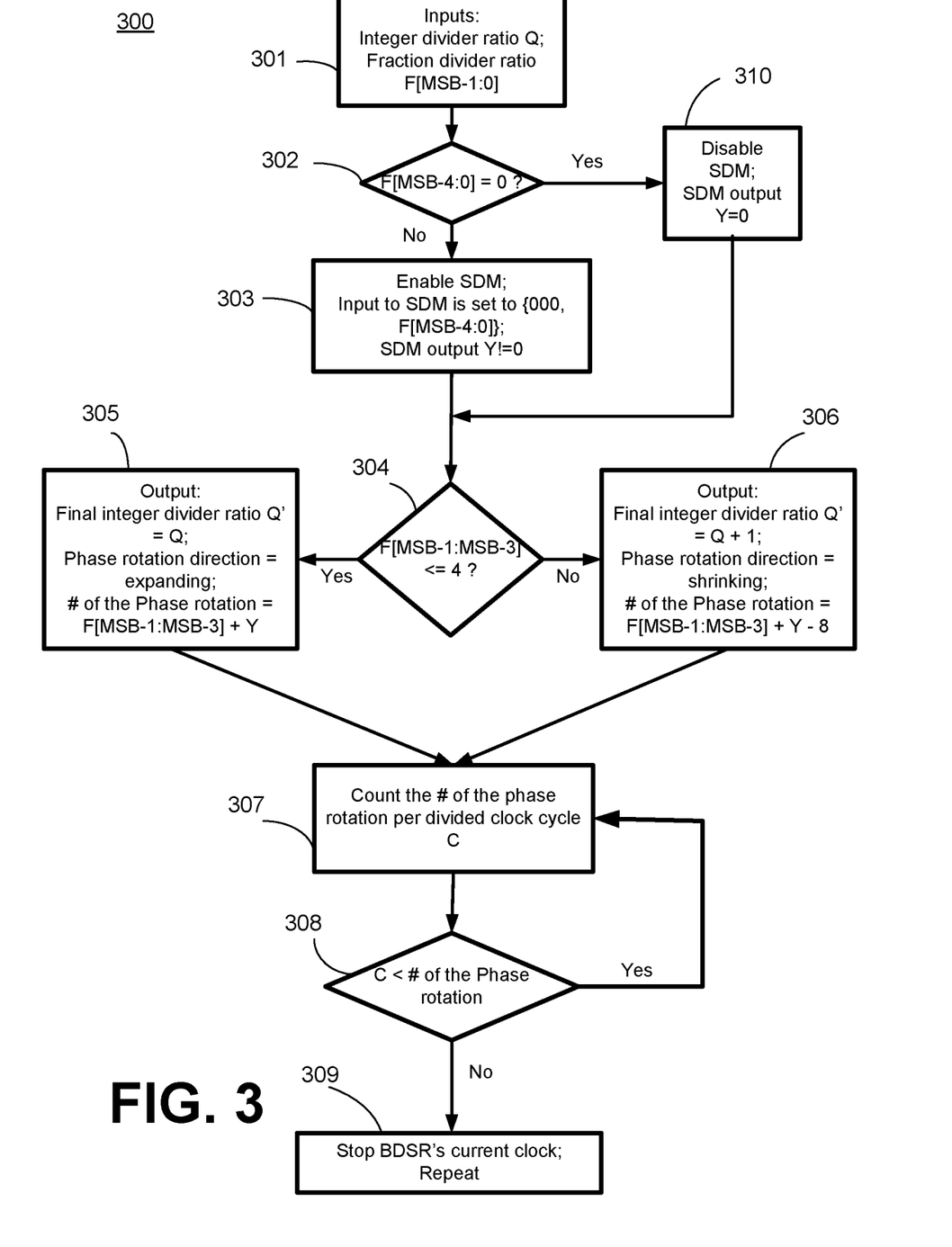
FIG. 3 is a flowchart of a method performed by a controller of the MMFD, according to one embodiment of the disclosure.

FIG. 3 is a flowchart of a method 300 performed by the controller 203 of the MMFD 200/104, according to one embodiment of the disclosure. FIG. 3 is described with reference to other figures in this disclosure. Although the blocks in the flowchart of FIG. 3 are shown in a particular order, the order of the actions can be modified. Thus, the illustrated embodiments can be performed in a different order, and some actions/blocks may be performed in parallel. Some of the blocks and/or operations listed in FIG. 3 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 301, the controller 203 receives the division ratio 107 as integer component 209 'Q' and fractional component 210 'F.' In one embodiment, 'F' is a digital word of length [MSB-1:0], where "MSB" is the most significant bit. In the following example, MSB=8. The notation [MSB-1:0] for MSB=8 is [8-1:0]=[7:0] which expands as an 8 bit word with bit 7 as the MSB and bit 0 as the least significant bit (LSB). Likewise the notation [7:5] refers to the last three most significant bits—bit 7, bit 6, and bit 5.

At block 302, a determination is made whether the [MSB-4:0] portion of the fractional component 210 'F' is zero.

If a determination is made that the [MSB-4:0] portion of the fractional component 210 'F' is zero, then the process proceeds to block 310 at which the sigma-delta modulator (SDM) 204 is disabled and its output 'Y' 215 is set to zero. The process then proceeds to block 304. If a determination is made that the [MSB-4:0] portion of the fractional component 210 'F' is not zero, then the process proceeds to block 303 at which the SDM 204 is enabled and its output 'Y' 215 is non-zero. At block 303, the input 214 to the SDM 204 is set to {000,F[MSB-4:0]}, where "000" indicates the first three MSBs of the input to the SDM 204.

The process then proceeds to block 304. At block 304, a determination is made whether F[MSB-1:MSB-3] is less than or equal to a predetermined or programmable value. In one embodiment, the predetermined or programmable value is four. In other embodiments, the predetermined or programmable value is greater or lesser than four. In the following example, predetermined or programmable value is four. In other embodiments, other values may be used.

If a determination is made that F[MSB-1:MSB-3] is less than or equal to four, then the modified integer ratio 'Q' 213 is set to the integer ratio 'Q' 209. In this embodiment, the phase rotation direction is clockwise i.e., expanding. The number of phase rotations are calculated to be F[MSB-1: MBS-3]+Y, where 'Y' 215 is the output of the sigma-delta modulator 204. For example, the controller 203 generates the rotation control signal 211 to indicate that the phases should be rotated by 2 phases in the clockwise direction.

If a determination is made that F[MSB-1:MSB-3] is greater than 4, then the modified integer ratio 'Q' 213 equal to the integer ratio 'Q' 209 plus one. In this embodiment, the phase rotation direction is counter clockwise i.e., shrinking. The number of phase rotations are calculated to be F[MSB-1:MBS-3]+Y-8.

The process then proceeds to block 307. At block 307, the controller 203 counts the number of phase rotations per divided clock cycle 'C,' where 'C' is the output of a counter (not shown) and indicates a number of phase rotations issued by the controller 203. At block 308, a determination is made whether 'C' is less than the number of phase rotations. If a determination is made that 'C' is less than the number of phase rotations then the process proceeds back to block 307 else the process proceeds to block 309 at which the clock to the bi-directional shift-register 201b is halted and the process repeats from block 301.

FIG. 4 is bi-directional shift-register (BDSR) 400/201b of the phase rotator 201 of the MMFD 200/104, according to one embodiment of the disclosure. Continuing with the example of eight phases in the clock signal 105, in one embodiment the BDSR 400/201b comprises eight registers 401-408 coupled together as shown forming a chain. In one embodiment, the first register 401 is a preset register while the other registers are reset registers. The output (Sel_clk_pN, where 'N' is 0 to 7) of each of the eight registers 401-408 forms the phase select signal 212.

For example, the output Sel_clk_p0 is the LSB of the phase select signal 212 while the output Sel_clk_p7 from register 408 is the MSB of the phase select signal 212. In this embodiment, all the eight registers 401-408 receive the same clock Current_clk. In one embodiment, the eight registers 401-408 are resettable to a predetermined output value via the Rstb signal. The rotation direction, clockwise or counter clockwise, is provided to each register 401-408 via the "Sign" signal generated by the controller 103.

The chain of shift registers 401-408 are coupled together such that the output "out" of register 401 is coupled to the "Data_left" of the next register 401, and so on. The chain of shift registers 401-408 are also coupled in opposite direction i.e., the other output "out" of register 401 is coupled to "Data_right" of the previous register 408 and so on.

FIG. 5 is timing diagram 500 of the signals associated with the BDSR 400/201b, according to one embodiment of the disclosure. Continuing with the example of eight phases for the multiphase clock 105, the signals 206 are the eight phases of the clock signal 206/105 received by the multiplexer 201a of the bi-directional phase rotator 201. The signal 501 "Sign" is generated by the controller 103 and indicates the rotation direction for the BDSR 400/201b i.e., whether the BDSR 400/201b is to shift data clockwise (right) or counter clockwise (left). The selection of the phases is performed by the 8 bit multiplexer select signal 216 i.e., Sel_clk_p0, Sel_clk_p1, Sel_clk_p2, Sel_clk_p3, Sel_clk_p4, Sel_clk_p6, Sel_clk_p6, and Sel_clk_p7.

In one embodiment, the bi-directional phase rotator 201 begins to operate after the assertion of the RSTb signal 502, which is the reset signal. The Current_clk 503 illustrates the process of shifting phases after the RSTb signal 502 is asserted. While the embodiments illustrate a falling edge (de-assertion) of RSTb 502 to cause reset of the BDSR 400/201b, the function of the RSTb 502 can be inverted. For example, the bi-directional phase rotator 201 may begin to operate after the de-assertion of the RSTb signal 502.

In this example, after each clock cycle (e.g., clock cycle of Clk_p0), a phase is rotated up to 4 phases. First, Clk_p0 is selected via Sel_clk_p0 signal. Then, in the next clock cycle, Clk_p1 is selected via Sel_clk_p1 signal. In the third clock cycle, Clk_p2 is selected via Sel_clk_p2 signal. In the fourth clock cycle, Clk_p3 is selected via Sel_clk_p3 signal. This is illustrated by the four cycles (p0, p1, p2, and p3) of Current_clk 503. The Current_clk 503 is then halted as indicated by block 309 of FIG. 3. After 8 clock cycles, the process is repeated again from block 301 of FIG. 3.

Figure 6:
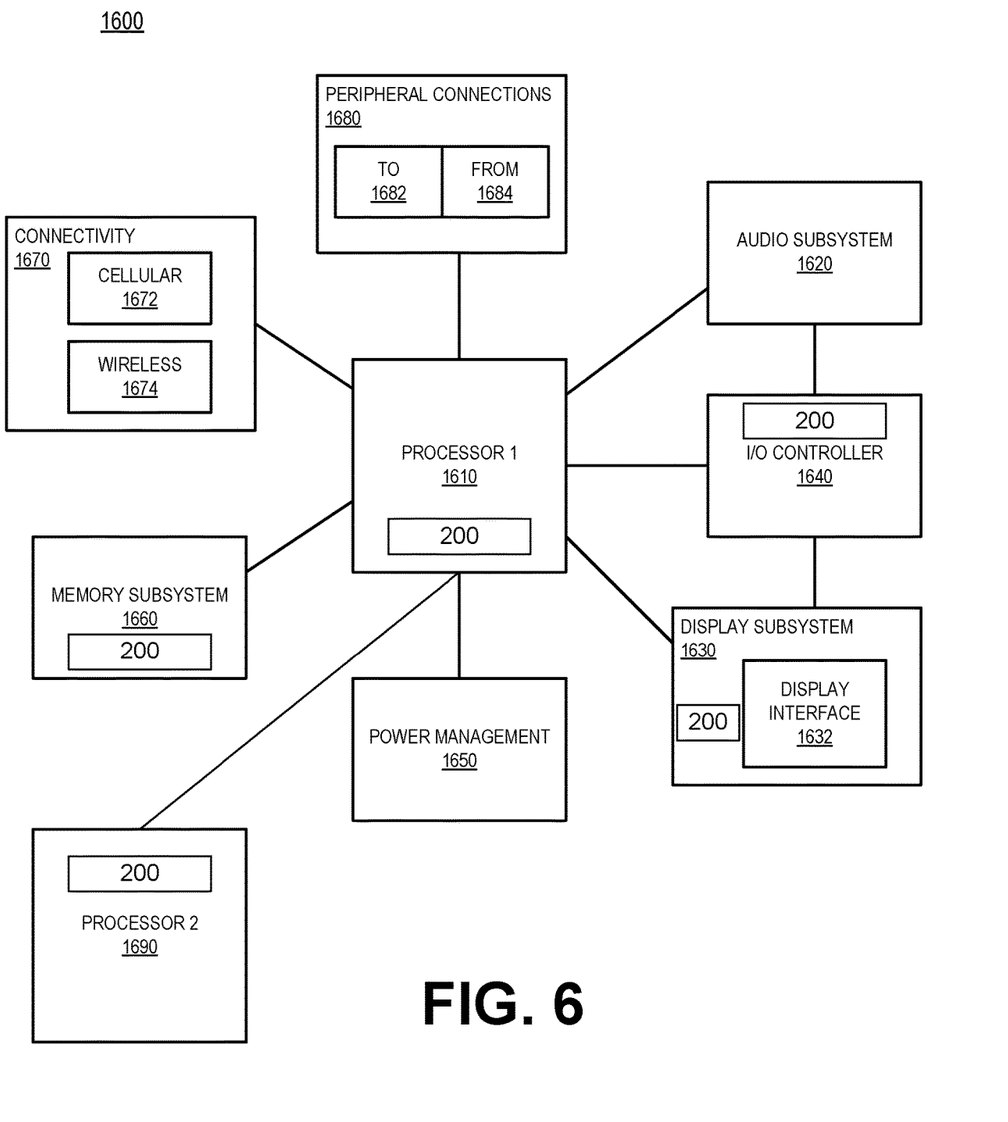
FIG. 6 is a system-level diagram of a smart device comprising a processor with the MMFD, according to one embodiment of the disclosure.

FIG. 6 is a system-level diagram of a smart device 1600 (also referred herein as a computing device) comprising a processor with the MMFD 104, according to one embodiment of the disclosure. FIG. 6 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, the computing device 1600 includes a first processor 1610 with the MMFD 104 and a second processor 1690 with the MMFD 104, according to the embodiments discussed herein. The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: a multi-modulus divider; and a phase provider to receive a multiphase periodic signal and operable to rotate phases of the multiphase periodic signal to generate an output which is received by the multi-modulus divider. In one embodiment, the phase provider is operable to rotate phases of the multiphase periodic signal in forward or backward direction relative to a transition edge of one of the phases of the multiphase periodic signal. In one embodiment, the phase provider comprises: a multiplexer; and a bidirectional phase selector coupled to the multiplexer. In one embodiment, the bidirectional phase selector comprises a shift register.

In one embodiment, the multiphase periodic signal is generated by an oscillator. In one embodiment, the oscillator is part of a phase locked loop (PLL). In one embodiment, the apparatus further comprises a controller which is operable to: select a divider ratio for the multi-modulus divider; monitor the output of the multi-modulus divider generated according to the selected divider ratio; and generate a rotation control signal for controlling the phase provider according to the monitored output. In one embodiment, the controller is operable to receive an integer ratio and a fractional word. In one embodiment, the controller is coupled to a sigma delta modulator.

In one embodiment, the controller is operable to generate the rotation control signal for at least one of the modes: integer mode; ditherless fractional mode; and dithering fractional mode.

In another example, a phase locked loop comprises: a phase detector to compare a reference clock signal with a feedback clock signal, and to generate a phase difference signal; a loop filter to generate a control signal according to the phase difference signal; an oscillator to generate a multiphase periodic signal according to the control signal; and a fractional divider to generate the feedback clock signal, the fractional divider including: a multi-modulus divider; and a phase provider to receive the multiphase periodic signal and operable to rotate phases of the multiphase periodic signal to generate an output which is received by the multi-modulus divider.

In one embodiment, the phase provider is operable to rotate phases of the multiphase periodic signal in forward or backward direction relative to a transition edge of one of the phases of the multiphase periodic signal. In one embodiment, the phase provider comprises: a multiplexer; and a bidirectional phase selector coupled to the multiplexer. In one embodiment, the bidirectional phase selector comprises a shift register. In one embodiment, the oscillator is one of: a digitally controlled oscillator (DCO); or a voltage controlled oscillator (VCO). In one embodiment, the PLL further comprises a controller which is operable to: select a divider ratio for the multi-modulus divider; monitor the output of the multi-modulus divider generated according to the selected divider ratio; and generate a rotation control signal for controlling the phase provider according to the monitored output. In one embodiment, the controller is coupled to a sigma delta modulator.

In another example, in one embodiment a system comprises: a reference clock generator to generate a reference clock signal; a memory unit; and a processor coupled to the memory unit, the processor having a frequency synthesizer operable to receive the reference clock signal and to generate a multiphase periodic signal, the frequency synthesizer including: a multi-modulus divider; and a phase provider to receive a multiphase periodic signal and operable to rotate phases of the multiphase periodic signal to generate an output which is received by the multi-modulus divider.

In one embodiment, the phase provider is operable to rotate phases of the multiphase periodic signal in forward or backward direction relative to a transition edge of one of the phases of the multiphase periodic signal. In one embodiment, the system further comprises a display unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

I claim:

1. An apparatus comprising:
   a divider; and
   a phase provider coupled to the divider, wherein the phase provider is to receive a multiphase periodic signal and is to rotate phases of the multiphase periodic signal to generate an output, wherein the phase provider comprises:
   a multiplexer to receive the multiphase periodic signal; and
   a phase selector coupled to the multiplexer, wherein the phase selector is a bidirectional phase selector which includes a shift register which comprises registers, wherein each register is to receive a first output from a first neighbor register and a second output from a second neighbor register, wherein the first and second neighbor registers are part of the registers of the shift-register; and
   a controller coupled to the phase selector and the divider, wherein the controller is to:
      select a divider ratio for the divider;
      monitor the output of the divider generated according to the selected divider ratio; and
      generate a rotation control signal to control the phase provider according to the monitored output,
   wherein the phase provider applies a clock signal having a series of periodic pulses, wherein the series of periodic pulses has a frequency which is the same as a frequency of the multiphase periodic signal, wherein the registers control the clock signal in response to an assertion or de-assertion of a reset signal.

2. The apparatus of claim 1, wherein the phase provider is to rotate phases of the multiphase periodic signal to generate an output which is received by the divider.

3. The apparatus of claim 1, wherein the registers of the shift register are eight registers coupled in a chain.

4. The apparatus of claim 1, wherein the phase selector is to dynamically change direction of rotation of the phases of the multiphase periodic signal in either a forward or backward direction.

5. The apparatus of claim 1, wherein the phase provider is operable to rotate phases of the multiphase periodic signal in a forward or backward direction relative to a transition edge of one of the phases of the multiphase periodic signal.

6. The apparatus of claim 1, wherein each register of the shift register has an output that is a phase select output to control the multiplexer.

7. The apparatus of claim 1, wherein the multiphase periodic signal is generated by an oscillator.

8. The apparatus of claim 7, wherein the oscillator is part of a phase locked loop (PLL).

9. The apparatus of claim 1, wherein the controller is to receive an integer ratio and a fractional word.

10. The apparatus of claim 1, wherein the controller is a sigma delta modulator.

11. The apparatus of claim 1, wherein the controller is to generate the rotation control signal for at least one of the modes:
    integer mode;
    ditherless fractional mode; or
    dithering fractional mode.

12. A phase locked loop (PLL) comprising:
    a phase detector to compare a reference clock signal with a feedback clock signal, and to generate a phase difference signal;
    a loop filter to generate a control signal according to the phase difference signal;
    an oscillator to generate a multiphase periodic signal according to the control signal; and a fractional divider to generate the feedback clock signal, the fractional divider including:
    a divider; and
    a phase provider coupled to the divider, wherein the phase provider is to receive a multiphase periodic signal and is to rotate phases of the multiphase periodic signal to generate an output, wherein the phase provider comprises:
    a multiplexer to receive the multiphase periodic signal;
    a controller to:
       select a divider ratio for the divider;
       monitor the output of the divider generated according to the selected divider ratio; and
       generate a rotation control signal for controlling the phase provider according to the monitored output and
    a bidirectional phase selector coupled to the multiplexer, wherein the bidirectional phase selector includes a shift register which comprises registers, wherein each register is to receive a first output from a first neighbor register and a second output from a second neighbor register, wherein the first and second neighbor registers are part of the registers of the shift-register,
    wherein the phase provider applies a clock signal having a series of periodic pulses, wherein the series of periodic pulses has a frequency which is the same as a frequency of the multiphase periodic signal, wherein the registers control the clock signal in response to an assertion or de-assertion of a reset signal, and
    wherein the controller is coupled to a sigma delta modulator.

13. The PLL of claim 12, wherein the phase provider is to rotate phases of the multiphase periodic signal in a forward or backward direction relative to a transition edge of one of the phases of the multiphase periodic signal.

14. The PLL of claim 12, wherein the oscillator is one of:
a digitally controlled oscillator (DCO); or
a voltage controlled oscillator (VCO).

15. A system comprising:
a reference clock generator to generate a reference clock signal;
a memory; and
a processor coupled to the memory, the processor including a frequency synthesizer to receive the reference clock signal and to generate a multiphase periodic signal, the frequency synthesizer including:
a divider; and
a phase provider to receive a multiphase periodic signal derived from an oscillator,
wherein the phase provider is to rotate phases of the multiphase periodic signal to generate an output which is received by the divider, and
wherein the phase provider applies a clock signal having a series of periodic pulses, wherein the series of periodic pulses has a frequency which is same as frequency of the multiphase periodic signal,
wherein the phase provider includes a shift register which comprises registers that control the clock signal in response to an assertion or de-assertion of a reset signal, wherein each register is to receive a first output from a first neighbor register and a second output from a second neighbor register, wherein the first and second neighbor registers are part of the registers of the shift-register.

16. The system of claim 15 further comprises a display to display contents processed by the processor.

17. An apparatus comprising:
a phase selector coupled to a multiplexer, wherein the phase selector is a bidirectional phase selector which includes a shift register which comprises registers, wherein each register is to receive a first output from a first neighbor register and a second output from a second neighbor register, wherein the first and second neighbor registers are part of the registers of the shift-register, wherein the phase selector applies a clock signal having a series of periodic pulses, wherein the series of periodic pulses has a frequency which is same as a frequency of a multiphase periodic signal, wherein the multiphase periodic signal is input to the phase selector, wherein the registers control the clock signal in response to an assertion or de-assertion of a reset signal; and
a controller coupled to the phase selector, wherein the controller is to cause the phase selector to rotate phases of the multiphase periodic signal to generate an output which is received by a divider, wherein the controller receives a division ratio as an integer and a fractional component as a digital word, wherein the controller is to cause a sigma-delta modulator to be disabled if a portion of the digital word is zero, and wherein the controller is to cause the sigma-delta modulator to be enabled if the portion the digital word is a non-zero value.

18. The apparatus of claim 17, wherein the portion of the digital word extends from a least significant bit to a most significant bit minus a predetermined threshold.

19. The apparatus of claim 18, wherein: the portion is a first portion;
the predetermined threshold is a first predetermined threshold; and
the controller causes the bidirectional phase selector to rotate the phases in a clockwise direction if a second portion of the digital work is less than or equal to a second predetermined threshold, wherein a number of phases rotated is a function of the second portion and an output of the sigma delta modulator; or
the controller causes the bidirectional phase selector to rotate the phases in a counter clockwise direction if the second portion of the digital work is greater than the second predetermined threshold.

20. The apparatus of claim 17, wherein the predetermined threshold is four.

* * * * *